(12) United States Patent
Park et al.

(10) Patent No.: US 10,684,655 B2
(45) Date of Patent: Jun. 16, 2020

(54) GLASS PROTECTIVE FILM FOR COVERING A CURVED SURFACE OF A PORTABLE DISPLAY, DEVICE OF ADHERING THE GLASS PROTECTIVE FILMS TO THE CURVED SURFACE OF THE PORTABLE DISPLAY, AND METHOD OF ADHERING THE GLASS PROTECTIVE FILM TO THE CURVED SURFACE USING THE DEVICE

(71) Applicant: Whitestone Co., Ltd., Cheonan-si (KR)

(72) Inventors: Chanhyun Park, Suwon-si (KR); In Su Yoon, Cheonan-si (KR); Jae Yong Jeong, Cheonan-si (KR)

(73) Assignee: Whitestone Co., Ltd., Cheonan-si (KR)

( * ) Notice: Subject to any disclaimer, the term of this patent is extended or adjusted under 35 U.S.C. 154(b) by 434 days.

(21) Appl. No.: 15/226,683

(22) Filed: Aug. 2, 2016

(65) Prior Publication Data
US 2018/0024594 A1    Jan. 25, 2018

(30) Foreign Application Priority Data
Jul. 19, 2016    (KR) .................. 10-2016-0091491

(51) Int. Cl.
*G06F 1/16*    (2006.01)
*C03C 1/00*    (2006.01)
(Continued)

(52) U.S. Cl.
CPC .............. *G06F 1/1656* (2013.01); *B32B 7/12* (2013.01); *B32B 17/06* (2013.01); *B32B 37/12* (2013.01);
(Continued)

(58) Field of Classification Search
CPC ........ G06F 1/1656; G06F 1/1613; C09J 7/22; C09J 5/00; B32B 7/12; B32B 37/12;
(Continued)

(56) References Cited

U.S. PATENT DOCUMENTS 9,169,422 B2    10/2015    O'Hare
9,248,628 B2    2/2016    Honeycutt
(Continued)

FOREIGN PATENT DOCUMENTS

CN    101724374 A    6/2010
CN    202190879 U    4/2012
(Continued)

OTHER PUBLICATIONS

Loca instructional YouTube Video, https://www.youtube.com/watch?v=H18Sk61D4Is, published on Nov. 8, 2015.
(Continued)

*Primary Examiner* — Michael N Orlando
*Assistant Examiner* — Christian Roldan
(74) *Attorney, Agent, or Firm* — Bishop, Diehl & Lee, Ltd.

(57) ABSTRACT

Disclosed is a glass protective film for covering a curved surface which protects display areas of a portable display including a flat display area and a curved display area. The glass protective film for covering the curved surface includes a glass film member having a flat area portion corresponding to the flat display area and a curved area portion corresponding to the curved display area and an adhesive layer adhering the entire area of the lower surface of the glass film member to the display area of the portable display.

8 Claims, 9 Drawing Sheets

(51) Int. Cl.
    G02B 6/32      (2006.01)
    B32B 7/12      (2006.01)
    H04B 1/3888    (2015.01)
    C09J 7/22      (2018.01)
    B32B 17/06     (2006.01)
    B32B 37/12     (2006.01)
    C09J 5/00      (2006.01)

(52) U.S. Cl.
    CPC . *C09J 5/00* (2013.01); *C09J 7/22* (2018.01); *G06F 1/1613* (2013.01); *G06F 1/1637* (2013.01); *H04B 1/3888* (2013.01); *B32B 2255/00* (2013.01); *B32B 2307/584* (2013.01); *B32B 2457/20* (2013.01); *G06F 2200/1634* (2013.01)

(58) Field of Classification Search
    CPC .............. B32B 17/06; B32B 2307/584; B32B 2457/20; B32B 2255/00; H04B 1/3888
    USPC .......................................................... 156/60
    See application file for complete search history.

(56) References Cited

U.S. PATENT DOCUMENTS

| | | | | |
|---|---|---|---|---|
| 9,868,274 B2 * | 1/2018 | Kim | .................... | B32B 37/182 |
| 10,100,238 B2 | 10/2018 | Lu | | |
| 2008/0085417 A1 * | 4/2008 | Takeko | .................... | B32B 7/12 |
| | | | | 428/441 |
| 2012/0172481 A1 | 7/2012 | Ha et al. | | |
| 2014/0220286 A1 * | 8/2014 | Honeycutt | ........ | B32B 17/10036 |
| | | | | 428/41.8 |

FOREIGN PATENT DOCUMENTS

| | | | |
|---|---|---|---|
| CN | 103853382 | A | 6/2014 |
| EP | 3012708 | A1 | 4/2016 |
| JP | 2010117903 | A | 5/2010 |
| KR | 101345149 | B1 | 12/2013 |
| KR | 101422827 | B1 | 7/2014 |
| KR | 101602103 | B1 | 3/2016 |
| WO | 2016008130 | A1 | 1/2016 |

OTHER PUBLICATIONS

Loca instructional YouTube Video, https://www.youtube.com/watch?v=bv_Bj6RY-Nc, published on Nov. 22, 2013.
Loca instructional YouTube Video, https://www.youtube.com/watch?v=8e7pUESE2KE, published on Apr. 24, 2014.
AmFilm's Full Screen (Edge to Edge) 3D Curved Tempered Glass Screen Protector for use with the Galaxy S6, Jul. 2015, available at https://www.amazon.com/dp/B00ZEEXWHK#customerReviews.
The Editorial Staff, Products on Display at Display Week 2012, May 1, 2012, SID 2012 International Symposium, Seminar, and Exhibition, available publicly at www.sid.org.

* cited by examiner

GLASS PROTECTIVE FILM FOR COVERING A CURVED SURFACE OF A PORTABLE DISPLAY, DEVICE OF ADHERING THE GLASS PROTECTIVE FILMS TO THE CURVED SURFACE OF THE PORTABLE DISPLAY, AND METHOD OF ADHERING THE GLASS PROTECTIVE FILM TO THE CURVED SURFACE USING THE DEVICE

CROSS-REFERENCE TO RELATED APPLICATION

This application claims the benefit of Korean Application No. 10-2016-0091491 filed on Jul. 19, 2016 with the Korean Intellectual Property Office, the disclosure of which is incorporated herein by reference.

BACKGROUND OF THE INVENTION

1. Field of the Invention

The present invention relates to a glass protective film, for covering a curved surface which is applied to a portable display including a flat display area and a curved display area, a method of adhering the same, and a method of adhering a glass protective film for covering a curved surface using the same.

2. Description of the Related Art

In the case of portable displays including a touch screen type display such as a smart phone, since information is input through a user's screen touch, a risk that, display areas of these devices are damaged by stabbing, pressing, scratch, and the like is high. In order to protect the portable display from the damage, various protective films are applied. Recently, tempered glass protection films having high hardness and an excellent protective function from external shocks have been widely used.

Meanwhile, recently, while appearances of mobile devices are changed, portable displays having a flat display area and a curved display area and the like have been commercialized. In the portable display including the curved area, there is a limit that a protective film applied to the portable display having only a flat display area in the related art may not be applied as it is. Particularly, in the case of the glass protective film, even though glass is molded and prepared according to a curved surface of the portable display to be applied to the portable display, due to a limitation on a manufacturing process, a self-curvature of the portable display varies for each product and a curvature of the manufactured protective glass also varies for each product, and thus there is a problem in that the curved protective glass can not be applied to the portable curved display by the existing method.

Therefore, development of a protective film for a curved cover glass which can be applied to the portable display having the curved display area has been urgently required.

SUMMARY OF THE INVENTION

An object of the present invention is to provide a glass protective film for covering a curved surface which has a flat area and a curved area to be applied to a portable display having a flat display area and a curved display area and can stably adhere the flat area and the curved area to the display area of the portable display.

Another object of the present invention, is to provide a device of adhering a glass protective film for covering a carved surface capable of adhering the glass protective film for covering the curved surface to the portable display.

Yet another object of the present invention is to provide a method of adhering the glass protective film for covering the curved surface to the portable display.

According to an aspect of the present invention, provided is a glass protective film for covering a curved surface which protects display areas of a portable display including a flat display area and a carved display area, the glass protective film includes: a glass film member having a flat area portion corresponding to the flat display area and a curved area portion including a curved surface extended from the edge of the flat area portion and corresponding to the curved display area; and an adhesive layer which is formed by spreading and curing the adhesive composition having fluidity between the entire area of the lower surface of the glass film member and the display area of the portable display and adheres the entire area of the lower surface of the glass film member to the display area of the portable display.

Preferably, the adhesive composition may have viscosity of 1 to 500 cps.

Preferably, the adhesive composition may include a UV polymerizable oligomer and a photopolymerization initiator. In this case, the UV polymerizable oligomer may include one or more selected from the group consisting of a modified acrylic-based oligomer, a polyester-based oligomer, an epoxy-based oligomer, an urethane-based oligomer, a polyether-based oligomer, a polyacrylic-based oligomer, and a silicon acrylate-based oligomer, and the photopolymerization initiator may include one or more selected from the group consisting of a benzoin ether-based compound, amines compounds, an α-hydroxy ketone-based compound, a phenyl glyoxylate-based compound, and an acyl phosphineoxide-based compound.

Preferably, adhesive composition may further include a diluent, and the diluent may include one or more selected from the group consisting of a styrene monomer, a methylmethacrylate monomer, an ethylmethacrylate monomer, an n-butylmethacrylate monomer, an iso-butylmethscrylate monomer, a t-butylmethacrylate monomer, a vinylchloride monomer, a vinylacetate monomer, an acrylonitrile monomer, a 2-ethylhexylmethacrylate monomer, a laurylmethacrylate monomer, a methylacrylate monomer, an ethylacrylate monomer, an n-butylacrylate monomer, an iso-butylacrylate monomer, a 2-ethylhexylacrylate monomer, an ethylene monomer, and an octadecylmethacrylate monomer; or one or more selected from the group consisting of acrylic acid, methacrylic acid, 2-hydroxyethylmethacrylate, 2-hydroxypropylmethacrylate, dimethylaminoethylmethacrylate, t-butylaminoethylmethacrylate, di-ethylaminoethylmethacrylate, glycidylmethacrylate, 2-hydroxyethylacrylate), 2-hydroxypropylacrylate, itaconic acid, maleicacid, acrylamide, and N-methylolacrylamide. In this case, in the adhesive composition, the content of the UV polymerizable oligomer may be 50 to 80 wt %, the content of the diluent may be 14 to 49 wt %, and the content of the photopolymerization initiator may be 0.5 to 5 wt %.

Preferably, the glass film member may include: a glass layer including the flat area portion and the curved area portion; a base layer including a polymer film covering the entire area of the lower surface of the glass layer; and an adhesive layer positioned between the glass layer and the base layer to adhere the glass layer and the base layer to each other, in which the adhesive layer may adhere the entire area of the lower surface of the base layer to the display area of the portable display.

Preferably, an adhesive enhancing pattern having protrusions and grooves positioned therebetween may be formed on the lower surface of the base layer. As an example, the protrusions may include dotted patterns, linear patterns extended in one direction, or lattice patterns. In this case, the lower surface of the base layer may have surface roughness Ra of 0.1 to 10 μm.

Preferably, the glass film member may further include a water-repellent/oil-repellent pattern which is formed along the edge of the base layer and made of a polymer material having both water repellency and oil repellency. The water-repellent/oil-repellent pattern may include one or more materials selected from a group consisting of polytetrafluoroethylene (PTFE), perfluoroalkoxy (PFA), fluorinated ethylene propylene (FEP), ethylene+tetrafluoroethylene (ETFE), an ethylene tetrafluoroethylene copolymer (ETEE), trichlorotrifluoroethylene (PCTFE), ethylene-chlorotrifluoroethylene (ECTFE), polyvinylidene fluoride (PVDF), polyvinyl fluoride (PVF), polyimide (PI), polyether ether ketone (PEEK), polyphenylene sulfide (PPS), polyamide (PA), polyacetal (POM), polyamide imide (PAI), polyether sulfone (PES), polyether imide (PEI), polycarbonate (PC), and polyphenylene ether (PPE). For example, the water-repellent/oil-repellent pattern may have a width of 10 to 500 μm.

Preferably, the glass film member may include the flat area portion and the curved area portion and include a glass layer adhered to the display area of the portable display by the adhesive layer. In this case, an adhesive enhancing pattern having protrusions and grooves positioned therebetween may be formed on the lower surface of the glass layer. Meanwhile, the glass film member may further include a water-repellent/oil-repellent pattern which is formed along the edge of the glass layer and made of a polymer material having both water repellency and oil repellency.

Preferably, the glass film member may include: a glass layer including the flat area portion and the curved area portion; a base layer including a polymer film disposed below the glass layer to expose the edge area of the lower surface of the glass layer; and an adhesive layer positioned between the glass layer and the base layer to adhere the glass layer and the base layer to each other, in which the adhesive layer may adhere the entire area of the lower surface of the base layer to the display area of the portable display. In this case, the glass film member may further include a water-repellent/oil-repellent pattern which is formed along the edge area of the exposed glass layer and made of a polymer material having both water repellency and oil repellency.

According to another aspect of the present invention, provided is a device of adhering a glass protective film for covering a curved surface, the device including: a lower case which includes a first support portion having a fixing groove to which the portable display is inserted at the center and a first flat upper plane surrounding the fixing groove and a first partition wall portion which is disposed on the first upper plane to surround the fixing groove and protrudes from the first upper plane; an upper case which includes a second support portion which is inserted to the first partition wall portion, has a second lower plane supported by the first upper plane and a second upper plane facing the second lower plane, and has an opening exposing the entire area of the fixing groove formed at the center and a second partition wall portion which is disposed on the second upper plane to surround the opening and protrudes from the second upper plane; and a coating plate which has a flat structure with a larger area than that of the fixing groove, is inserted to the inside of the second partition wall portion to be supported by the second upper plane to be positioned on the portable display, and has one or more injection holes for injecting the adhesive composition which are formed at the center.

Preferably, the depth of the fixing groove may be smaller than the thickness of the portable display, and a sum of the depth of the fixing groove and the thickness of the second support portion may be larger than the thickness of the portable display.

According to yet another aspect of the present invention, provided is a method of adhering a glass protective film for covering a curved surface, the method including: coating an adhesive composition on a display area of a portable display; loading a glass film member on the display area of the portable display coated with the adhesive composition to disperse find flow the adhesive composition between the portable display and the glass film, member; and curing the adhesive composition.

Preferably, the adhesive composition may have viscosity of 1 to 500 cps, and in the case of loading the glass film member, the adhesive composition may be dispersed and flow to the entire area between the glass film member and the portable display through capillarity by the weight of the glass film member, or external loads or pressuring. In order to prevent generation of an air layer, the adhesive composition may be slantly loaded at an angle of about 30° or less, preferably, about 5° to 15° with respect to the flat display area of the portable display.

As described above, according to the present invention, since a fluidic adhesive composition is dispersed and flows between the glass film member and the portable display to form and cure the adhesive composition layer and the glass film member is adhered to the portable display, even though the curvature of the curved display area and the curvature of the curved area of the glass film member in the portable display are different from each other, the entire area of the glass film member can be stably adhered to the portable display. As a result, deterioration of touch sensitivity or deterioration of the display characteristics which is caused by the air layer formed between the glass film member and the portable display is not generated. In addition, by a self leveling effect of the fluidic adhesive composition, the air layer is not generated around the edge of the area between the glass film member and the portable display and thus the adhesion strength between the glass film member and the portable display may also be improved.

Further, in the present invention, by forming the adhesion enhancing pattern on the surface which directly contacts the adhesive composition of the glass film member and forming the water-repellent/oil-repellent pattern along the edge of the surface, in the process of adhering the glass film member to the portable display, the adhesive composition is prevented from being leaked to the outside of the glass film member, thereby stably and easily adhering the glass film member to the portable display.

DETAILED DESCRIPTION OF THE PREFERRED EMBODIMENTS

Figure 1A:
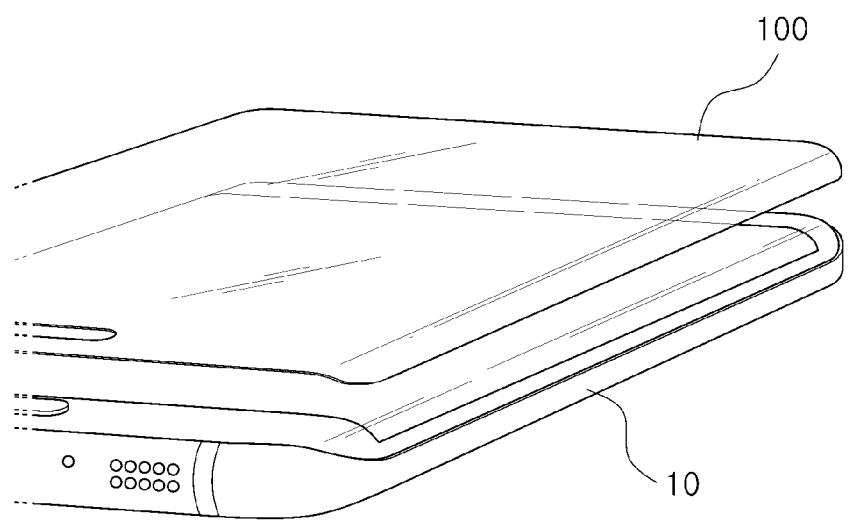
FIGS. 1A and 1B are a perspective view and a cross-sectional view for describing a glass protective film for covering a curved surface according to an exemplary embodiment of the present invention.

Hereinafter, an exemplary embodiment of the present invention will be described in more detail with reference to the accompanying drawings. The present invention may be variously modified and have various exemplary embodiments, so that specific embodiments will be illustrated in the drawings and described in the detailed description. However, this does not limit the present invention within specific exemplary embodiments, and it should be understood that the present invention covers all the modifications, equivalents and replacements within the idea and technical scope of the present invention. In the description of each drawing, similar reference numerals are used for similar constitute elements. In the accompanying drawings, dimensions of structures are illustrated to be more enlarged than actual dimensions for clarity of the present invention.

Terms such as first or second may be used to describe various components but the components are not limited by the above terminologies. The above terms are used only to discriminate one component from the other component. For example, a first element may be named a second element without departing from the scope of the present invention. Likewise, a second element may be named a first element.

Terms used in the present application are used only to describe specific exemplary embodiments, and are not intended to limit the present invention. Singular expressions used herein include plurals expressions unless they have definitely opposite meanings. In the present application, it should be understood that term, "include" or "have" indicates that a feature, a number, a step, an operation, a component, a part or the combination thereof described in the specification is present, but does not exclude a possibility of presence or addition of one or more other features, numbers, steps, operations, components, parts or combinations, in advance.

If it is not contrarily defined, all terms used herein including technological or scientific terms have the same meaning as those generally understood by a person with ordinary skill in the art. Terms defined in generally used dictionary shall be construed that they have meanings matching those in the context of a related art, and shall not be construed in ideal or excessively formal meanings unless they are clearly defined in the present application.

Figure 1B:
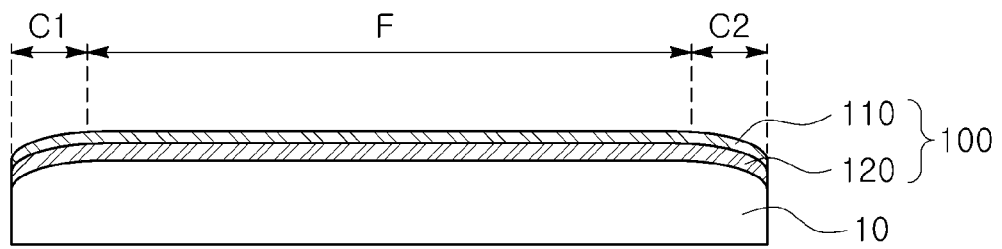

FIGS. 1A and 1B are a perspective view and a cross-sectional view for describing a glass protective film for covering a curved surface according to an exemplary embodiment of the present invention.

Referring to FIGS. 1A and 1B, a glass protective film 100 for covering a curved surface according to an exemplary embodiment of the present invention may protect a portable display 10 including a curved display area as well as a flat display area, for example, the entire display area of the portable display 10 which is applied to a smart phone. In the exemplary embodiment, the glass protective film 100 for covering the curved surface according to an exemplary embodiment of the present invention may include a glass film member 110 and an adhesive layer 120.

The glass film member 110 may include a flat area portion F which is positioned at the center and substantially flat and one or more curved area portions C1 and C2 which are extended from an edge of the flat area portion F and formed by a curved surface. The flat area portion F and the curved area portions C1 and C2 may be integrally formed.

The flat area portion F may have a rectangular shape with a pair of long sides facing each other and a pair of short sides connecting the long sides to each other and is disposed on the flat display area among the display areas of the portable display 10 to protect the flat display area.

The curved area portions C1 and C2 include a first curved area portion C1 and a second curved area portion C2 which are extended from each of the long sides of the flat area portion F to have a predetermined width and formed of convex curved surfaces based on the display area of the portable display 10. Each of the first curved area portion C1 and the second curved area portion C2 may have a curvature which is continuously changed so as not to form a discontinuous surface on an interface with the flat area portion F and is disposed on the curved display areas formed at both sides of the flat display area among the display areas of the portable display 10, respectively, to protect the curved display areas.

The adhesive layer 120 is positioned between the entire area of the lower surface of the glass film member 110 and the display area of the portable display 110 corresponding thereto to adhere the entire area of the lower surface of the glass film member 10 to the portable display 10. That is, the adhesive layer 120 may be positioned between the curved display area of the portable display 10 and the curved areas C1 and C2 of the glass film member 110 as well as between the flat display area of the portable display 10 and the flat area F of the glass film member 110. In this specification, the adhering of the glass film member 110 to the portable display 10 or the display area of the portable display 10 by the adhesive layer 120 is defined to include a case where the glass film member 110 is not only directly adhered to the display area of the portable display 10, but also adhered to another film or coating film (not illustrated) adhered to the display area of the portable display 10.

When the adhesive layer 120 adheres only a partial area of the lower surface of the glass film member 110 to the display area of the portable display 10, an air layer is formed in an area without forming the adhesive layer 120 among areas between the glass film member 110 and the display area of the portable display 10 to deteriorate sensitivity of the portable display 10 for a user's touch and deteriorate a display characteristic of the portable display 10 in terms of a user which views the portable display 10 through the glass film member 110 due to a difference in an optical characteristic between the air layer and the adhesive layer 120. However, in the present invention, the entire area of the lower surface of the glass film member 110 is adhered to the display area of the portable display 10 by using the adhesive layer 120 to prevent the touch sensitivity or the display characteristic from being deteriorated.

In the exemplary embodiment of the present invention, the adhesive layer 120 may be formed by coating an adhesive composition having fluidity on the display area of the portable display 10 and then loading the glass film member 110 on the display area of the portable display 10 to spread the adhesive composition to the entire area of the lower surface of the glass film member 110 by a weight of the glass film member 110, and curing the adhesive composition. As an example, the adhesive, composition may be cured by photopolymerization or thermal polymerization.

In general, due to a limitation on the manufacturing process, a curvature radius of the curved area of the glass film member 110 and a curvature radius of the curved display area of the portable display 10 have different values within an available margin for each product, and thus the curvature radius of the curved display area of the portable display 10 is different from the curvature radius of the curved area of the glass film member 110 applied thereto. As a result, in the case of adhering the glass film member 110 to the portable display 10 by using a known adhesive member such as an adhesive film without fluidity, the adhesive member may not adhere the entire area of the lower surface of the glass film member 110 to the portable display 10 to form a undesired air layer between the glass film member 110 and the display area of the portable display 10.

However, in the present invention, as such, the adhesive composition having fluidity is spread between the glass film member 110 and the portable display 10 and cured to adhere the glass film member 110 to the portable display 10 and adhere the entire area of the lower surface of the glass film member 110 to the portable display 10, thereby preventing the sensitivity for the user's touch and the display characteristic from being deteriorated as described above. That is, even though a distance between the glass film member 110 and the portable display 10 is not constant, a thickness thereof may be changed to compensate a difference therebetween, and thus the adhesive layer 120 formed above may adhere the entire area of the lower surface of the glass film member 110 to the portable display 10.

In an exemplary embodiment, the adhesive composition may have viscosity of about 1 to 500 cps. When the viscosity of the adhesive composition is less than 1 cps, there is a problem that the surface tension of the adhesive composition is very weak and thus the adhesive composition passes the area between the glass film member 110 and the portable display 10 to be spread to the outside of the glass film member 110. When the viscosity of the adhesive composition is greater than 500 cps, there is a problem that the fluidity of the adhesive composition is low and thus the adhesive composition is not spread to the entire area of the lower surface of the glass film member 110 only by a self-weight of the glass film member 110. As an example, the viscosity of the adhesive composition may have viscosity of about 10 to 250 cps, preferably.

In an exemplary embodiment, the adhesive composition may include a UV polymerizable oligomer and a photopolymerization initiator.

The UV polymerizable oligomer may include one or more selected from a modified acrylic-based oligomer, a polyester-based oligomer, an epoxy-based oligomer, an urethane-based oligomer, a polyether-based, oligomer, a polyacrylic-based oligomer, a silicon acrylate-based oligomer, and the like, and the photopolymerization initiator may include one or more selected from a benzoin ether-based compound, amines compounds, an α-hydroxy ketone-based compound, a phenyl glyoxylate-based compound, an acyl phosphineoxide-based compound, and the like.

Meanwhile, the adhesive composition may further include a diluent. The diluent may control the viscosity of the adhesive composition and improve a property of the adhesive layer 120 after curing. The diluent may include one or more selected from a styrene monomer, a methylmethacrylate monomer, an ethylmethacrylate monomer, an n-butylmethacrylate monomer, an iso-butylmethacrylate monomer, a t-butylmethacrylate monomer, a vinylchloride monomer, a vinylacetate monomer, an acrylonitrile monomer, a 2-ethylhexylmethacrylate monomer, a laurylmethacrylate monomer, a methylacrylate monomer, an ethylacrylate monomer, an n-butylacrylate monomer, an iso-butylacrylate monomer, a 2-ethylhexylacrylate monomer, an ethylene monomer, an octadecylmethacrylate monomer, and the like, or one or more selected from acrylic acid, methacrylic acid, 2-hydroxyethylmethacrylate, 2-hydroxypropylmethacrylate, dimethylaminoethylmethacrylate, t-butylaminoethylmethacrylate, diethylaminoethylmethacrylate, glycidylmethacrylate, 2-hydroxyethylacrylate, 2-hydroxypropylacrylate, itaconic acid, maleicacid, acrylamide, N-methylolacrylamide, and the like.

Meanwhile, the adhesive composition may further include additives including a photosensitizer, a colorant, a thickening agent, a polymerization inhibitor, and the like.

In an exemplary embodiment, when the polymerization composition includes the UV polymerizable oligomer, the diluent, the photopolymerization initiator, and the additives, the content of the UV polymerizable oligomer may be about 50 to 80 wt %, the content of the diluent may be about 14 to 49 wt %, the content of the photopolymerization initiator may be about 0.5 to 5 wt %, and the content of the additives may be about 0.5 to 1 wt %.

Hereinafter, the glass film member 110 will be described with reference to FIGS. 2 and 3.

Figure 2:
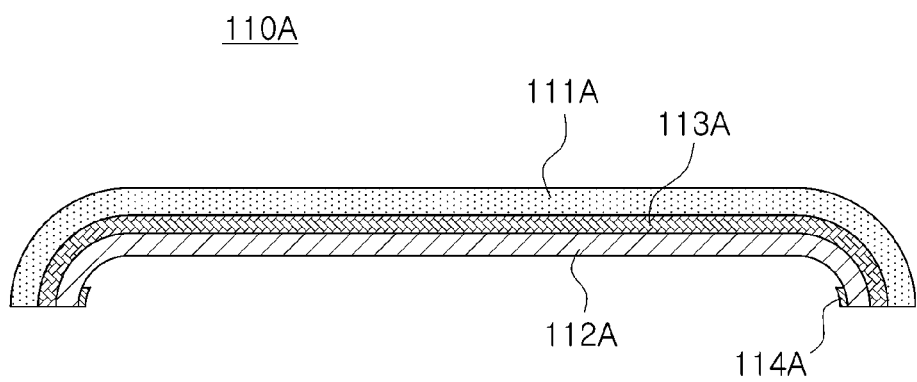
FIG. 2 is a cross-sectional view for describing a first exemplary embodiment of a glass film member illustrated in FIGS. 1A and 1B.

FIG. 2 is a cross-sectional view for describing a first exemplary embodiment of a glass film member illustrated in FIGS. 1A and 1B.

Referring to FIG. 2, a glass film member 110A according to the first exemplary embodiment of present invention may include a glass layer 111A, a base layer 112A, and an adhesive layer 113A.

The glass layer 111A may be made of a known glass material and include the flat area F and the curved areas C1 and C2 as described above.

The base layer 112A may be made, of a transparent polymer material, for example, polyethylene terephthalate (PET), acrylic resin, or the like, include the flat area F and the curved areas C1 and C2, and may be formed to cover the entire area of the lower surface of the glass layer 111A.

The adhesive layer 113A is disposed between the glass layer 111A and the base layer 112A to adhere the glass layer 111A and the base layer 112A to each other. The material of the adhesive layer 113A is not particularly limited thereto, and known adhesive materials may be used without limitation.

In the glass film member 110 having such a structure, the base layer 112A adhered to the glass layer 111A by the adhesive layer 113A may be adhered to the display area of the portable display 10 by the adhesive layer 120 described above and prevent the glass layer 111A from being scattered when the glass layer 111A is damaged.

In an exemplary embodiment, an adhesion enhancing pattern (not illustrated) may be formed on the lower surface of the base layer 112A which is adhered to the display area of the portable display 10. The adhesion enhancing pattern may have a structure in which protrusions and grooves positioned therebetween are continuously disposed. For example, the protrusions may include doted patterns formed regularly or irregularly, linear patterns extended in one direction, lattice patterns, and the like. A method of forming the adhesion enhancing pattern is not particularly limited thereto. For example, the adhesion enhancing pattern may be formed a sand blasting process, a dry etching process, a wet etching process, and the like or formed by methods such as mold coating.

As such, in the case of forming the adhesion enhancing pattern on the lower surface of the base layer 112A contacting the adhesive layer 120, a surface area of the lower surface of the base layer 112A is increased to enhance the adhesion to the adhesive layer 120, and in the process of adhering the glass film member 110 to the portable display 10, the surface tension of the adhesive composition is increased to prevent the adhesive composition from being leaked to the outside of the glass film member 110. In addition, in the present invention, since the entire area of the lower surface of the base layer 112A is adhered to the portable display 10 by the adhesive layer 120, even though the adhesion enhancing pattern is formed on the lower surface of the base layer 112A, problems of deterioration of display characteristics in which the adhesion enhancing pattern is viewed to the user or light transmittance is deteriorated may not occur.

As an example, the lower surface of the base layer 112A with the adhesion enhancing pattern may have surface roughness Ra of about 0.1 to 1.0 µm. When the surface roughness of the lower surface of the base layer 112A is less than 0.1 µm, it is difficult to achieve the technical effects described above. When the surface roughness of the lower surface of the base layer 112A is greater than 1.0 µm, the thickness of the base layer 112A is excessively increased and a height difference between the adhesion enhancing patterns is excessively increased to prevent the adhesive composition from being uniformly spread and rather cause a problem that the adhesion is partially deteriorated.

Meanwhile, in the exemplary embodiment of the present invention, the glass film member 110 may further include a water-repellent/oil-repellent pattern 114A which is formed with a predetermined width along an edge of the base layer 112A.

The water-repellent/oil-repellent pattern 114A may be formed of a material having both water repellency and oil repellency. The material having both water repellency and oil repellency may be used as the material of the water-repellent/oil-repellent pattern 114A without limitation and is not particularly limited thereto. For example, the water-repellent/oil-repellent pattern 114A may be formed of a fluorinated polymeric material, such as polytetrafluoroethylene (PTFE), perfluoroalkoxy (PFA), fluorinated ethylene propylene (FEP), ethylene+tetrafluoroethylene (ETFE), an ethylene tetrafluoroethylene copolymer (ETEE), trichlorotrifluoroethylene (PCTFE), ethylene-chlorotrifluoroethylene (ECTFE), polyvinylidene fluoride (PVDF), and polyvinyl fluoride (PVF), or a non-fluorinated polymeric material, such as polyimide (PI), polyether ether ketone (PEEK), polyphenylene sulfide (PPS), polyamide (PA), polyacetal (POM), polyamide imide (PAI), polyether sulfone (PES), polyether imide (PEI), polycarbonate (PC), and polyphenylene ether (PPE).

Since the adhesive composition for forming the adhesive layer 120 of the present invention generally has a hydrophilic or hydrophobic property, in the case of forming the water-repellent/oil-repellent pattern 114A which is formed with a predetermined width along an edge of the base layer 112A, in the process of adhering the glass film member 110 to the portable display 10, it is possible to more stably prevent the adhesive composition from being leaked to the outside of the glass film member 110.

As an example, the water-repellent/oil-repellent pattern 114A may be formed with a width of about 10 to 500 µm. When the width of the water-repellent/oil-repellent pattern 114A is less than 10 µm, processing cost of forming the water-repellent/oil-repellent pattern 114A is increased and it is difficult to achieve the technical effect. When the width of the water-repellent/oil-repellent pattern 114A is greater than 500 µm, the adhesive between the glass film member 110 and the portable display 10 is relatively decreased in the area with the water-repellent/oil-repellent pattern 114A and thus there is a problem that the detachment between the glass film member 110 and the portable display 10 is generated in the area. For example, the water-repellent/oil-repellent pattern 114A may be formed with a width of about 100 to 300 µm.

Meanwhile, when the glass film member 110A includes an opening that exposes a touch button, a camera lens, or the like of the portable display, that is, the water-repellent/oil-repellent pattern 114A may be formed with a predetermined width, for example, a width of about 10 to 500 µm from an edge of the opening to surround the opening.

Figure 3:
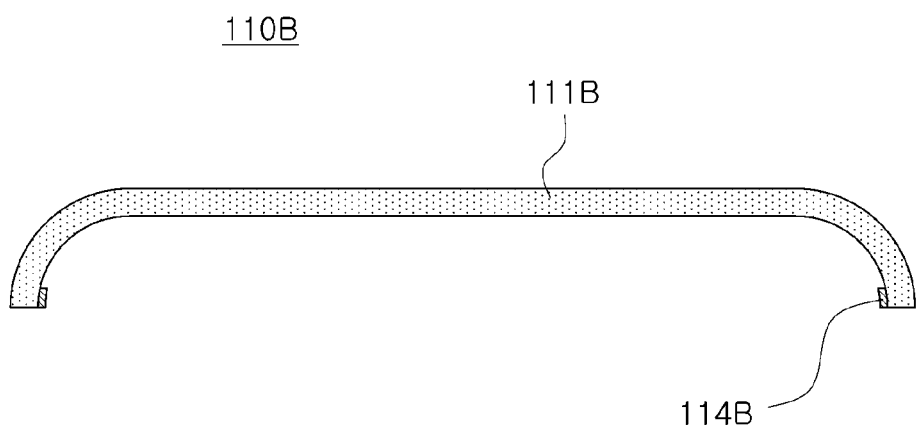
FIG. 3 is a cross-sectional view for describing a second exemplary embodiment of a glass film member illustrated in FIGS. 1A and 1B.

FIG. 3 is a cross-sectional view for describing a second exemplary embodiment of a glass film member illustrated in FIGS. 1A and 1B.

Referring to FIG. 3, a glass film member HOB according to the second exemplary embodiment of present invention may include a glass layer 111B and a water-repellent/oil-repellent pattern 114B.

The glass film member HOB according to the exemplary embodiment does not include the base layer 112A and the adhesive layer 113A of the glass film member 110A according to the first exemplary embodiment of present invention as illustrated in FIG. 2, and the glass layer 111B may be directly adhered to the portable display 10 through the adhesive layer 120.

Since the glass layer 111B is substantially the same as the glass layer 111A of the glass film member 110 illustrated in FIG. 2 except that the adhesion enhancing pattern (not illustrated) described above may be formed on the lower surface, the duplicated detailed description therefor will be omitted.

In addition, since the water-repellent/oil-repellent pattern 114B is substantially the same as the water-repellent/oil-repellent pattern 114A of the glass film member 110 illustrated in FIG. 2 except that the water-repellent/oil-repellent pattern 114B is formed along the edge of the lower surface of the glass layer 111B, the duplicated detailed description therefor will be omitted.

Figure 4:
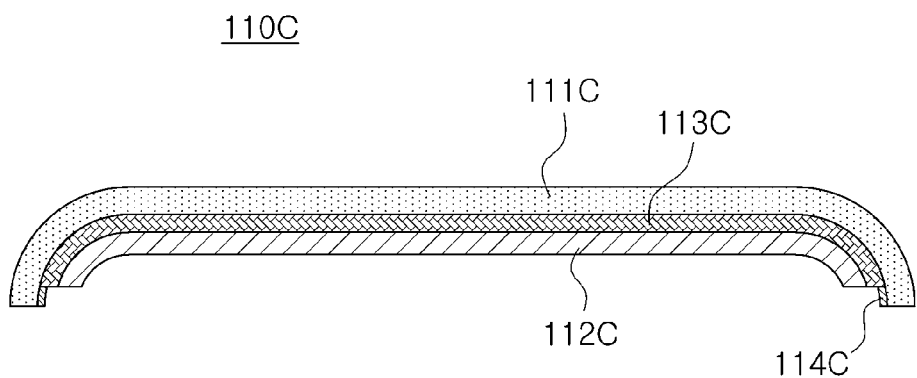
FIG. 4 is a cross-sectional view for describing a third exemplary embodiment of a glass film member illustrated in FIGS. 1A and 1B.

FIG. 4 is a cross-sectional view for describing a third exemplary embodiment of a glass film member illustrated in FIGS. 1A and 1B.

Referring to FIG. 4, a glass film member 110C according to the third exemplary embodiment of the present invention may include a glass layer 111C, a base layer 112C, an adhesive layer 113C, and a water-repellent/oil-repellent pattern 114C.

Since the glass film member 110C according to the exemplary embodiment is substantially the same as the glass film, member 110 described with reference to FIG. 2 except that the base layer 112C and the adhesive layer 113C are disposed below the glass layer 111C to expose the edge of the lower surface of the glass layer 111C with a predetermined width and the water-repellent/oil-repellent pattern 114C is formed on the exposed lower surface of the glass layer 114C, the duplicated detailed description therefor will be described.

The base layer 112C and the adhesive layer 113C may expose the edge of the lower surface of the glass layer 111C by a width of about 10 to 500 μm, preferably about 100 to 300 μm. In the process of adhering the glass film member HOC on the portable display 10, in the adhesive composition for forming the adhesive layer 120, the exposed portion between the glass film member 110 and the portable display 10 is convex to the outside by the surface tension. In this case, when an external object contacts the exposed portion of the adhesive composition, the surface tension of the adhesive composition is broken and thus a problem that the adhesive composition is leaked to the outside of the glass film member 110 may occur. The problem may be caused even in the case of adhering the glass film member 110 to the portable display 10 by using the device 1000 of adhering the glass protective film for covering the curved surface according to the exemplary embodiment of the present invention to be described with reference to FIGS. 5 to 8. When the base layer 112C and the adhesive layer 113C are formed to expose the edge of the lower surface of the glass layer 111C with a width of about 10 to 500 μm as described above, the exposed convex portion of the adhesive composition does not protrude to the outside of the glass layer 111C, and as a result, the adhesive composition contacts the device 1000 of adhering the glass protective film for covering the curved surface to prevent the adhesive composition from being leaked to the outside.

Figure 5:
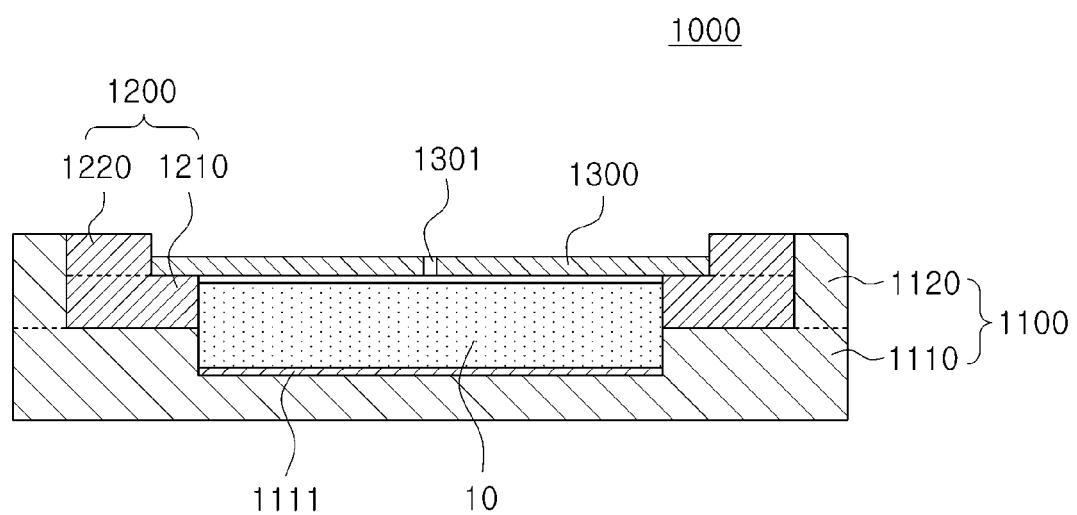
FIG. 5 is a cross-sectional view for describing a device of adhering a glass protective film for covering a curved surface according to another exemplary embodiment of the present invention.
Figure 6:
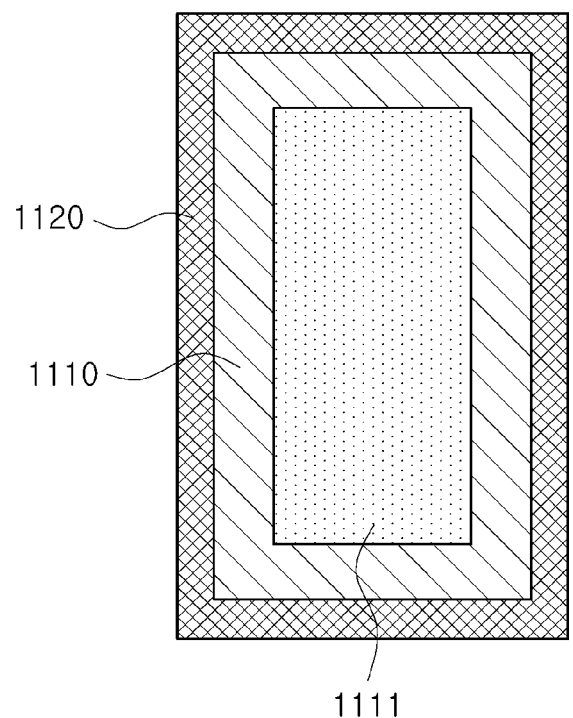
FIG. 6 is a plan view for describing a lower case illustrated in FIG. 5.
Figure 7:
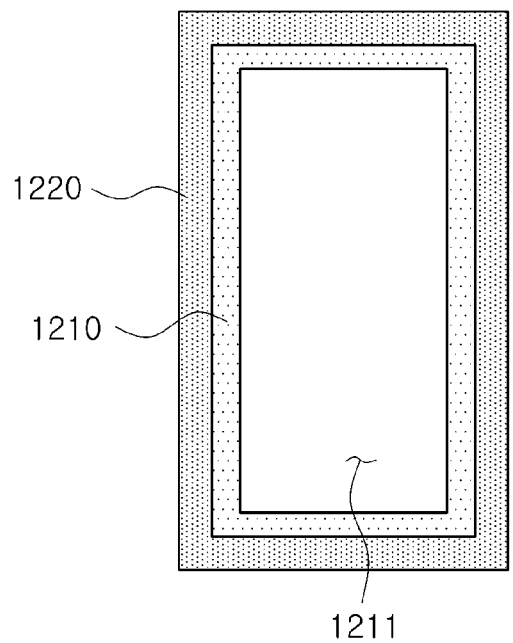
FIG. 7 is a plan view for describing an upper case illustrated in FIG. 5.
Figure 8:
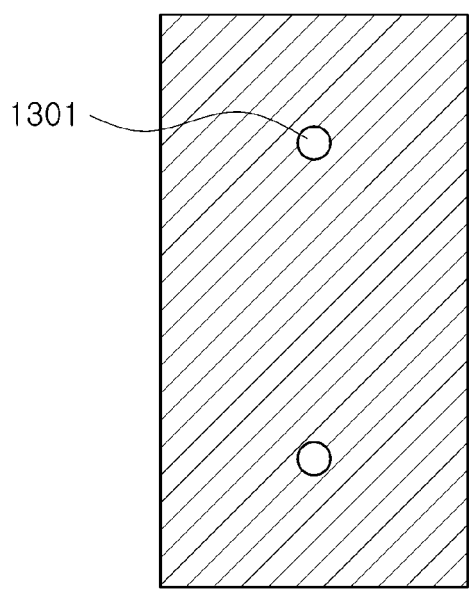
FIG. 8 is a plan view for describing a coating member illustrated in FIG. 5.

FIG. 5 is a cross-sectional view for describing a device of adhering a glass protective film for covering a curved surface according to another exemplary embodiment of the present invention and FIGS. 6 to 8 are plan views for describing a lower case, an upper case, and a coating member illustrated in FIG. 5, respectively.

Referring to FIGS. 5 to 8, the adhesive composition contacts the device 1000 of adhering the glass protective film for covering the curved surface according to the exemplary embodiment of the present invention includes a lower case 1100, an upper case 1200, and a coating plate 1300.

The lower case 1100 may include a first support portion 1110 and a first partition wall portion 1120.

The first support portion 1110 may provide a fixing groove 1111 to which the portable display 10 may be inserted and fixed at the center and a first flat upper plane surrounding the fixing groove 1111. The fixing groove 1111 may have a shape corresponding to the planar shape of the portable display 10 and have a depth smaller than a thickness of the portable display 10. While the portable display 10 inserted to the fixing groove 1111 is fixed so as not to move in a horizontal direction, the fixing groove 1111 may protrude from the first upper plane of the first support portion 1110 by a predetermined thickness. The shape of a first lower surface of the first support portion 1110 facing the first upper plane is not particularly limited thereto.

The first partition wall portion 1120 is disposed on the first upper plane of the first support portion 1110 to surround the fixing groove 1111 and may protrude from the first upper plane of the first support portion 1110 with a predetermined height. The first partition wall portion 1120 may be formed to expose the fixing groove 1111 and the first upper plane by a predetermined width from the fixing groove 1111.

The upper case 1200 may include a second support portion 1210 and a second partition wall portion 1220.

The second support portion 1210 may provide a second lower plane which is supported in an area exposed by the first partition wall portion 1120 in the first upper plane of the first support portion 1110 and a second upper plane positioned on the second lower plane to face the second lower plane, and the fixing groove nil and an opening 1211 exposing the entire portable display 10 inserted thereto may be formed at the center.

As an example, the second support portion 1210 is inserted to the inside of the first partition wall portion 1120, and thus the second lower plane is supported by the first upper plane of the first support portion 1110 which is exposed by the first partition wall portion 1120 and an outer side connecting the second lower plane and the second upper side is supported by the inner surface of the first partition wall portion 1120 to be fixed so as not to move in the horizontal direction. The opening 1211 of the second support portion 1210 may have the same planar shape as the fixing groove 1111, and the portable display 10 protruding from the first upper plane of the first support portion 1110 may be inserted and fixed to the opening 1211 of the second support portion 1210. In order to support the coating plate 1300 to be spaced apart from the portable display 10 at a predetermined interval, the thickness of the second support portion 1210 may be larger than the thickness of the portable display 10 at the portion protruding from the first upper plane.

The second partition wall portion 1220 is disposed on the second upper plane of the second support portion 1210 to surround the opening 1211 and may protrude from the second upper plane with a predetermined height. The second partition wall portion 1220 may be formed to expose the opening 1211 and the second upper plane by a predetermined width from the opening 1211.

The coating plate 1300 may have a flat structure, having a larger area than the fixing groove 1111 and is inserted to the inside of the second partition wall 1220 to support the lower surface by the second upper plane exposed by the second partition wall 1220, and one or more injection holes for injecting the adhesive, composition may be formed at the center.

In FIG. 8, two injection holes are illustrated, but two or more injection holes may also be formed in the coating plate 1300. In addition, as described above, since the thickness of the second support portion 1210 is larger than the thickness of the portable display 10 at the portion protruding from the first upper plane, the coating plate 1300 may be disposed to be spaced apart from the display area of the portable, display 10 at a predetermined interval.

Meanwhile, in the case of being inserted to the inside of the second partition wall 1220, the side of the coating plate 1300 is supported by the inner surface of the second partition wall 1220 to prevent the side of the coating plate 1300 from flowing in the horizontal direction.

Hereinafter, a method of adhering the glass protective film to the portable display 10 by using the device 1000 of adhering the glass protective film for covering the curved surface will be described.

The method of adhering the glass protective film for covering the curved surface according to the exemplary embodiment of the present invention includes coating an adhesive composition on a display area of a portable display 10; forming an adhesive composition layer between the portable display 10 and a glass film member 110 by loading the glass film member 110 on the display area of the portable display 10 on which the adhesive composition is coated; and curing the adhesive composition.

In the coating of the adhesive composition on the display area of the portable display 10, first, the portable display 10 is fixed to a fixing groove 1111 of the lower case 1100 and then the upper case 1200 may be inserted and fixed into the first partition wall 1120 of the lower case 1100. Next, the coating plate 1300 is inserted into the second partition wall 1220 of the upper case 1200 to be fixed to the top of the portable display 10 and thereafter, the adhesive composition may be coated on the display area of the portable display 10 through an injection hole 1301 of the coating plate 1300.

In the forming of the adhesive composition layer between the glass film member 110 and the portable display 10 by loading the glass film member 110 on the display area of the portable display 10 coated with the adhesive composition, first, after the coating plate 1300 is removed from the upper case 1200, the glass film member 110 may be loaded on the display area of the portable display 10 through the opening 1211 of the second support portion 1210 of the upper case 1200. In the case of loading the glass film member 110 on the display area of the portable display 10 coated with the adhesive composition, the adhesive composition is dispersed and flows to the entire area between the glass film member no and the portable display 10 through capillarity by the weight of the glass film member 110 to form the adhesive composition layer. Meanwhile, when additional external force is not applied to the glass film member 110, the adhesive composition may not be leaked to the outside of the area between the glass film member 110 and the portable display 10 by the surface tension.

In the curing of the adhesive composition, the adhesive composition may be photo-cured or thermally cured. The photo-curing method and the thermal-curing method of the adhesive composition are not particularly limited and known methods may be applied without limitation. For example, when the adhesive composition is photo-cured, the adhesive composition may be cured by ultraviolet light, visible light, or infrared light irradiated from sun light, fluorescent light, LED light, a UV lamp, and the like.

As described above, according to the present invention, since a fluidic adhesive composition is dispersed and flows between the glass film member and the portable display to form and cure the adhesive composition layer and the glass film member is adhered to the portable display, even though the curvature of the curved display area and the curvature of the curved area of the glass film member in the portable display are different from each other, the entire area of the glass film member can be stably adhered to the portable display. As a result, deterioration of touch sensitivity or deterioration of the display characteristics which is caused by the air layer formed between the glass film member and the portable display is not generated.

Further, in the present invention, by forming the adhesion enhancing pattern on the surface which directly contacts the adhesive composition of the glass film member and forming the water-repellent/oil-repellent pattern along the edge of the surface, in the process of adhering the glass film member to the portable display, the adhesive composition is prevented from being leaked to the outside of the glass film member, thereby stably and easily adhering the glass film member to the portable display.

The present invention has been described with reference to the preferred embodiments. However, it will be appreciated by those, skilled in the art that various modifications and changes of the present invention can be made without departing from the spirit and the scope of the present invention which are defined in the appended claims and their equivalents.

What is claimed is:

1. A glass protective film configured for covering an exterior display area of a portable device, the exterior display having a contour including a flat display area and a curved display area, the glass protective film comprising:

a glass film member having an outer edge and a contour including a flat area portion corresponding to the flat display area of the exterior display and a curved area portion comprised of a curved surface extended from an edge of the flat area portion and corresponding to the curved display area of the exterior display, wherein the contour of the glass film member deviates from the contour of the exterior display to create a varying gap between the two, wherein the glass film member includes:

a glass layer, including the flat area portion and the curved area portion;

a base layer including a polymer film covering the entire area of the lower surface of the glass layer; and a first adhesive layer positioned between the glass layer and the base layer to adhere the glass layer and the base layer to each other;

a water-repellent and oil-repellent pattern having a predetermined width within the range of 10 to 500 μm formed only along the outer edge of the glass film member and made of a polymer material having both water repellent and oil repellent properties; and a second adhesive layer formed by an adhesive composition configured to be applied as a fluid to the exterior display, the adhesive composition having a viscosity in the range of from 1 to 500 cps and comprising a UV polymerizable oligomer and a photopolymerization initiator, so as to spread and be cured between an entire area of the glass film member and the exterior display area of the portable device, and wherein the water-repellent and oil-repellent pattern is configured to prevent the fluid adhesive composition from spreading beyond the exterior display so that the resulting second adhesive layer adheres the entire area of the glass film member to the exterior display area of the portable device by fluidly filing the varying gap.

2. The glass protective film of claim 1, wherein the UV polymerizable oligomer includes one or more selected from the group consisting of a modified acrylic-based oligomer, a polyester-based oligomer, an epoxy-based oligomer, an urethane-based oligomer, a polyether-based oligomer, a poly-acrylic-based oligomer, and a silicon acrylate-based oligomer, and the photopolymerization initiator includes one or more selected from the group consisting of a benzoin ether-based compound, amines compounds, an α-hydroxy ketone-based compound, a phenyl glyoxylate-based compound, and an acyl phosphineoxide-based compound.

3. The glass protective film of claim 1, wherein the adhesive composition further includes a diluent, and the diluent includes one or more selected from the group consisting of a styrene monomer, a methylmethacrylate monomer, an ethylmethacrylate monomer, an n-butylmethacrylate monomer, an iso-butylmethacrylate monomer, a t-butylmethacrylate monomer, a vinylchloride monomer, a vinylacetate monomer, an acrylonitrile monomer, a 2-ethylhexylmethacrylate monomer, a laurylmethacrylate monomer, a methylacrylate monomer, an ethylacrylate monomer, an n-butylacrylate monomer, an iso-butylacrylate monomer, a 2-ethylhexylacrylate monomer, an ethylene monomer, and an octadecylmethacrylate monomer; or one or more selected from the group consisting, of acrylic acid, methacrylic acid, 2-hydroxyethylmethacrylate, 2-hydroxypropylmethacrylate, dimethylaminoethylmethacrylate, t-butylaminoethylmethacrylate, diethylaminoethylmethacrylate, glycidylmethacrylate, 2-hydroxyethylacrylate, 2-hydroxypropylacrylate, itaconic acid, maleicacid, acrylamide, and N-methylolacrylamide.

4. The glass protective film of claim 3, wherein in the adhesive composition, the content of the UV polymerizable oligomer is 50 to 80 wt %, the content of the diluent is 14 to 43 wt %, and the content of the photopolymerization initiator is 0.5 to 5 wt %.

5. The glass protective film of claim 1, wherein an adhesive enhancing pattern having protrusions and grooves positioned therebetween is formed on the lower surface of the base layer.

6. The glass protective film of claim 5, wherein the protrusions includes dotted patterns, linear patterns extended in one direction, or lattice patterns.

7. The glass protective film of claim 1, wherein the water-repellent/oil-repellent pattern comprises one or more materials selected from the group consisting of polytetrafluoroethylene (PTFE), perfluoroalkoxy (PFA), fluorinated ethylene propylene (FEP), ethylene+tetrafluoroethylene (ETFE), an ethylene tetrafluoroethylene copolymer (ETEE), trichlorotrifluoroethylene (PCTFE), ethylene-chlorotrifluoroethylene (ECTFE), polyvinylidene fluoride (PVDF), polyvinyl fluoride (PVF), polyimide (PI), polyether etherketone (PEEK), polyphenylene sulfide (PPS), polyamide (PA), polyacetal (POM), polyamide imide (PAT), polyether sulfone (PES), polyether imide (PEI), polycarbonate (PC), and polyphenylene ether (PPE).

8. The glass protective film of claim 1, wherein an adhesive enhancing pattern having protrusions and grooves positioned therebetween is formed on the lower surface of the glass layer.

* * * * *